US009153796B2

(12) United States Patent
Sato et al.

(10) Patent No.: US 9,153,796 B2
(45) Date of Patent: Oct. 6, 2015

(54) FABRICATION METHOD FOR ORGANIC EL DEVICE

(71) Applicant: SEIKO EPSON CORPORATION, Tokyo (JP)

(72) Inventors: Hisakatsu Sato, Sakata (JP); Satoshi Murata, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/587,517

(22) Filed: Dec. 31, 2014

(65) Prior Publication Data

US 2015/0118774 A1 Apr. 30, 2015

Related U.S. Application Data

(63) Continuation of application No. 14/196,769, filed on Mar. 4, 2014, now Pat. No. 8,956,898.

(30) Foreign Application Priority Data

Mar. 27, 2013 (JP) .................................. 2013-065749

(51) Int. Cl.
*H01L 27/32* (2006.01)
*H01L 51/56* (2006.01)
(Continued)

(52) U.S. Cl.
CPC ............ *H01L 51/56* (2013.01); *H01L 27/3211* (2013.01); *H01L 51/5036* (2013.01); *H01L 51/5218* (2013.01); *H01L 51/5256* (2013.01); *H01L 51/5262* (2013.01); *H01L 51/5265* (2013.01); *H01L 51/5271* (2013.01);
(Continued)

(58) Field of Classification Search
CPC . H01L 51/5203; H01L 51/5036; H01L 51/56; H01L 51/5218; H01L 51/5256; H01L 51/5262; H01L 51/5265; H01L 27/3211; H01L 2227/323; H01L 2251/5315; H01L 2251/558
USPC ................ 257/88, 89, 59; 313/500, 506, 509; 438/22, 28, 29, 99, 82
See application file for complete search history.

(56) References Cited

U.S. PATENT DOCUMENTS

| 6,885,148 B2* | 4/2005 | Yudasaka ...................... 313/504 |
| 7,510,455 B2 | 3/2009 | Suzuki |
| 7,646,148 B2* | 1/2010 | Nagayama .................... 313/512 |

(Continued)

FOREIGN PATENT DOCUMENTS

| JP | A-2007-188653 | 7/2007 |
| JP | A-2008-218081 | 9/2008 |

(Continued)

*Primary Examiner* — Michael Trinh
(74) *Attorney, Agent, or Firm* — Oliff PLC

(57) ABSTRACT

The fabrication method for an organic EL device according to the invention includes: forming a third insulating layer on a first insulating layer; removing the third insulating layer in a first pixel region by etching the third insulating layer; forming a second insulating layer that has different thicknesses in a first pixel and a second pixel and has a flat first surface by forming a precursor insulating layer to continuously cover a first reflection film and a second reflection film and then planarizing an upper surface of the precursor insulating layer; and forming a first pixel electrode and a second pixel electrode on the first surface of the second insulating layer. The first insulating layer is slower in the rate at which the layer is removed by etching than the third insulating layer.

6 Claims, 5 Drawing Sheets

(51) Int. Cl.
  H01L 51/50    (2006.01)
  H01L 51/52    (2006.01)

(52) U.S. Cl.
  CPC ... *H01L2227/323* (2013.01); *H01L 2251/5315* (2013.01); *H01L 2251/558* (2013.01)

(56) References Cited

U.S. PATENT DOCUMENTS

| | | | |
|---|---|---|---|
| 7,812,519 B2* | 10/2010 | Chang et al. | 313/504 |
| 7,839,081 B2 | 11/2010 | Kubota et al. | |
| 7,986,089 B2* | 7/2011 | Kitabayashi | 313/503 |
| 8,040,052 B2* | 10/2011 | Kobayashi | 313/506 |
| 8,253,127 B2* | 8/2012 | Kang et al. | 257/40 |
| 8,344,362 B2* | 1/2013 | Kitabayashi et al. | 257/40 |
| 8,501,532 B2* | 8/2013 | Jeong et al. | 438/99 |
| 2009/0278450 A1 | 11/2009 | Sonoyama et al. | |
| 2011/0114981 A1 | 5/2011 | Higaki et al. | |
| 2011/0317429 A1 | 12/2011 | Aiba et al. | |

FOREIGN PATENT DOCUMENTS

| | | |
|---|---|---|
| JP | A-2009-49003 | 3/2009 |
| JP | A-2009-272150 | 11/2009 |
| JP | A-2010-232163 | 10/2010 |
| JP | A-2011-18451 | 1/2011 |

\* cited by examiner

FABRICATION METHOD FOR ORGANIC EL DEVICE

This is a Continuation of application Ser. No. 14/196,769 filed Mar. 4, 2014, U.S. Pat. No. 8,956,898 which claims the benefit of Japanese Patent Application No. 2013-065749, filed Mar. 27, 2013. The disclosure of the prior applications is hereby incorporated by reference herein in its entirety.

BACKGROUND

1. Technical Field

The present invention relates to a fabrication method for an organic EL device.

2. Related Art

An organic electroluminescence (EL) device has a structure where a light-emitting layer made of a light-emitting material is interposed between an anode (pixel electrode) and a cathode (counter electrode). For example, as described in JP-A-2007-188653, a resonance structure is known where a reflection film is provided on the side of the anode opposite to the side facing the light-emitting layer to allow light emitted from the light-emitting layer to travel between the reflection film and the cathode thereby extracting light having a spectrum high in peak intensity and narrow in width. Having such a structure, the color reproducibility of light emission can be improved.

An example of a fabrication method for an organic EL device is as follows: an anode is formed on a reflection film, and a transparent conductive film is formed on the anode for varying the light path length according to the colors such as RGB. A light-emitting layer and a cathode are then formed sequentially on the transparent conductive film. The device can therefore be configured to have an optimal light path length for each color, and this can enhance the brightness and improve the color reproducibility.

To attain an optimal light path length, however, it is necessary to form the multilayer film including the transparent conductive film, etc. to have a thickness corresponding to a desired wavelength of each color in each light-emitting region, and this causes formation of a step along the periphery of a pixel region of each color, etc. When a step is formed along the periphery of the pixel region, unintentional parasitic light emission may occur due to a deviation of the value of an optimal light path length (resonance), causing emission of a different color in a step portion. To avoid this problem, it is necessary to form a light-shielding oxide film covering the step portion to prevent parasitic light emission. This will complicate the fabrication process, and also reduce the light emission-capable region for each color because of the light-shielding film formed along the periphery of the pixel region of each color.

SUMMARY

An advantage of some aspects of the invention is providing a fabrication method for an organic EL device capable of preventing or reducing unintentional parasitic light emission without the necessity of providing a light-shielding member along the periphery of the pixel region of each color, and can be achieved in the following modes or application examples.

APPLICATION EXAMPLE 1

According to this application example, a fabrication method for an organic EL device is provided. The organic EL device includes a first pixel having a first insulating layer, a first reflection film provided on the first insulating layer, a second insulating layer provided on the first reflection film, a first pixel electrode provided on the second insulating layer, a first light-emitting layer provided on the first pixel electrode, and a first counter electrode provided on the first light-emitting layer, first-color light being resonated between the first reflection film and the first counter electrode, and a second pixel having the first insulating layer, a third insulating layer provided on the first insulating layer, a second reflection film provided on the third insulating layer, the second insulating layer provided on the second reflection film, a second pixel electrode provided on the second insulating layer, a second light-emitting layer provided on the second pixel electrode, and a second counter electrode provided on the second light-emitting layer, second-color light being resonated between the second reflection film and the second counter electrode. The fabrication method includes: forming the third insulating layer on the first insulating layer; removing the third insulating layer in a first pixel region by etching the third insulating layer; forming the second insulating layer that has different thicknesses in the first pixel and the second pixel and has a flat first surface by forming a precursor insulating layer to continuously cover the first reflection film and the second reflection film and then planarizing an upper surface of the precursor insulating layer; and forming the first pixel electrode and the second pixel electrode on the first surface of the second insulating layer. The first insulating layer is slower in the rate at which the layer is removed by the etching than the third insulating layer.

With the fabrication method for an organic EL device according to this application example, which includes forming the third insulating layer capable of adjusting the thickness of the second insulating layer on the first insulating layer, an organic EL device where the first surface of the second insulating layer is planarized in a simple process can be provided. That is, with no step formed on the second insulating layer, it is unnecessary to form a light-shielding film separately. Thus, an organic EL device where parasitic light emission is prevented or reduced can be fabricated by a simpler method.

APPLICATION EXAMPLE 2

In a fabrication method for an organic EL device according to this application example, it is preferable that the first reflection film and the second reflection film be formed integrally.

The third insulating layer that makes the surface positions of the first reflection film and the second reflection film different from each other is already formed under the first reflection film and the second reflection film. Therefore, the surface positions of the first and second reflection films from the first insulating layer can be easily made different even though these reflection films are formed integrally using a known film formation technique. Thus, the fabrication process can be further simplified.

APPLICATION EXAMPLE 3

In a fabrication method for an organic EL device according to this application example, it is preferable that, in forming the second insulating layer, forming a precursor insulating layer include forming a fourth insulating layer on the first reflection film and the second reflection film and forming a fifth insulating layer on the fourth insulating layer, planarizing an upper surface include removing the fifth insulating layer in a second pixel region by subjecting the fifth insulating layer to chemical mechanical polishing processing, and the fourth insulating layer be slower in the rate at which the layer is removed by the chemical mechanical polishing processing than the fifth insulating layer.

By the above method, the second insulating layer can have a further flat first surface. Thus, a fabrication method for an organic EL device where parasitic light emission is further less likely to occur can be provided.

In addition, since the second insulating layer has the fourth insulating layer functioning as a stopper layer, the thickness of the second insulating layer 40 can be controlled more simply in the chemical mechanical polishing processing. Thus, a fabrication method for an organic EL device with further improved reliability can be provided.

APPLICATION EXAMPLE 4

In a fabrication method for an organic EL device according to this application example, it is preferable that the fourth insulating layer be made of silicon nitride, and the fifth insulating layer be made of silicon oxide.

APPLICATION EXAMPLE 5

In a fabrication method for an organic EL device according to this application example, it is preferable that the first insulating layer be made of silicon nitride, and the third insulating layer be made of silicon oxide.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes a preferred embodiment of the invention in detail with reference to the accompanying drawings. It should be noted that the embodiment described hereinafter is not intended to unduly limit the contents of the invention defined in the appended claims, and that all parts of the configuration described hereinafter do not necessarily constitute essential requirements of the invention.

1. Configuration of Organic EL Device

Figure 1:
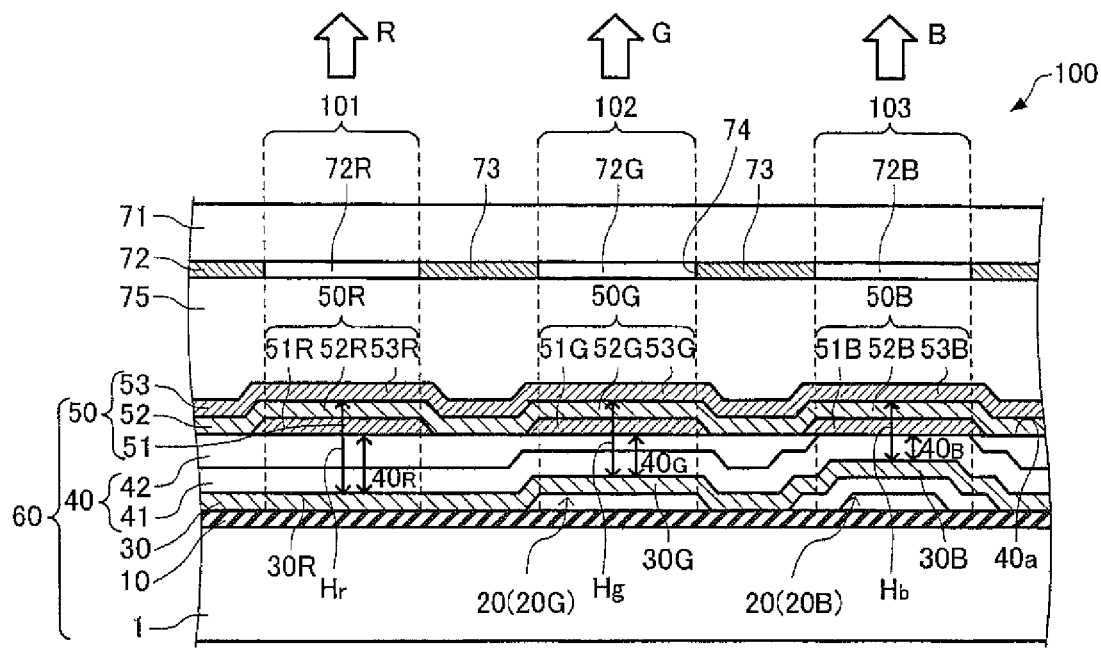
FIG. 1 is a cross-sectional view schematically showing the structure of an organic EL device fabricated by a fabrication method for an organic EL device of an embodiment of the invention.

First, an organic EL device 100 fabricated by a fabrication method for an organic EL device of this embodiment will be described with reference to the relevant drawings. FIG. 1 is a cross-sectional view schematically showing the organic EL device 100. For easy understanding of the configuration, the ratios of the thickness and size among the components, the angles thereof, etc. are changed appropriately. In FIG. 1, the white arrows indicate light beams output from pixel regions where R represents red, G green, and B blue.

The organic EL device 100 is a top-emission type light-emitting display device and has a resonance structure that resonates light between a reflection film 30 and a counter electrode 53.

As shown in FIG. 1, the organic EL device 100 has a plurality of light-emitting elements 50 (50R, 50G, 50B) including the first pixel and the second pixel arranged on the surface of a substrate 1. Note that interconnects and circuits provided on the substrate 1, as well as layers forming such components, are omitted in FIG. 1. The light-emitting elements 50 (50R, 50G, 50B) are elements each emitting light having a wavelength corresponding to any of a plurality of colors (red, green, and blue). In this embodiment, the device may have such a structure that the light-emitting element 50R outputs red light, 50G outputs green light, and SOB outputs blue light, or such a structure that all of the light-emitting elements 50 output white light.

The organic EL device 100 has a top-emission structure where light emitted from the light-emitting elements 50 travels in the direction opposite to the substrate 1 as described above. Therefore, an opaque plate material such as ceramics and a metal sheet, as well as a plate material having a light transmission property such as glass, may be used as the substrate 1.

Transistors that drive the light-emitting elements 50 in the pixel regions are formed on the substrate 1. A plurality of transistors may be arranged in a matrix on the substrate 1. Examples of the transistors formed on the substrate 1 include transistors for switching each having a gate electrode to which a scanning signal is applied via a scanning line, storage capacitors each holding a pixel signal applied from a data line via the transistor for switching, and transistors for driving each having a gate electrode to which the pixel signal held by the storage capacitor is applied. Interconnects, through electrodes, an interlayer insulating film made of silicon nitride, silicon oxide, etc., and the like are provided appropriately above the transistors. Under the substrate 1, a flexible substrate is provided although not shown. The flexible substrate is provided with ICs for driving connected to the interconnects.

A first insulating layer 10 (first underlying layer 10) is provided on the substrate 1. The first insulating layer 10 is an insulating layer functioning as an etching stopper when a third insulating layer 20 to be described later is formed. The thickness and material of the first insulating layer 10 are not specifically limited as far as the layer 10 functions as an etching stopper at the formation of the third insulating layer 20. Specifically, the material of the first insulating layer 10 is selected from materials smaller in etching rate than the third insulating layer 20. In other words, it is selected from materials that are less easily etched than the third insulating layer 20. For example, when the third insulating layer 20 is made of silicon oxide, the material of the first insulating layer 10 may be silicon nitride.

On the first insulating layer 10, the third insulating layer 20 is formed appropriately depending on the pixel regions. As illustrated, when a first pixel 101 outputs light longest in wavelength (red), no third insulating layer 20 is formed in the first pixel region 101, but the third insulating layers 20 (20G, 20B) are respectively formed in a second pixel region 102 and a third pixel region 103.

The third insulating layer 20 (second underlying layer 20) is provided appropriately for adjusting the thickness of a second insulating layer 40 provided for light path adjustment in each pixel region. The thickness of the third insulating layer 20 is designed to be larger as the wavelength of the light output from the corresponding pixel is shorter. That is, the thickness of the third insulating layer 20 is determined appropriately so that the second insulating layer 40 has a predetermined thickness in each pixel region. Therefore, as illustrated, in the third pixel 103 that outputs blue light shorter in wavelength than green light, the third insulating layer 20B thicker than the third insulating layer 20G is provided. The third insulating layer 20 may be a single layer (20G), or have a multilayer structure (20B) of a plurality of layers placed on top of each other, as illustrated. As described above, the material of the third insulating layer 20 is selected from ones larger in etching rate than the first insulating layer 10. For example, the material of the third insulating layer 20 may be silicon oxide.

The reflection film 30 (30R, 30G, 30B) is provided on the first insulating layer 10 with the third insulating layers 20 formed thereon. As illustrated, in the first pixel region 101, the second pixel region 102, and the third pixel region 103, the reflection film 30 may be formed integrally so as to cover the third insulating layers 20. In other words, the first reflection film 30R, the second reflection film 30G, and the third reflection film 30B may be formed to be continuous. Alternatively, although not shown, the reflection film 30 may be formed only in the pixel regions separately. The reflection film 30 is formed of a material having a light reflection property. Examples of such a material include aluminum, silver, and an alloy including aluminum and silver as main elements.

The second insulating layer 40 (light path adjusting layer 40) is provided to cover the reflection film 30 (30R, 30G, 30B). A first surface 40a that is an upper surface of the second insulating layer 40 is a planarized surface (subjected to planarization processing such as chemical mechanical polishing processing). The second insulating layer 40 is a dielectric, formed of an inorganic insulating film such as silicon oxide and silicon oxynitride, for example. Alternatively, the second insulating layer 40 may be formed of an organic resin such as acrylic resin and polyimide resin, for example.

The second insulating layer 40 has different thicknesses ($40_R$, $40_G$, $40_B$) in the respective pixel regions. That is, the second insulating layer 40 has a function of adjusting the path length of output light in each pixel region. In the organic EL device 100, where the third insulating layer 20 having a predetermined thickness is appropriately provided in each pixel region as an underlying layer of the second insulating layer 40, the second insulating layer 40 can have the planarized first surface 40a and yet have different thicknesses among the pixel regions.

The organic EL device 100, with the second insulating layer 40 having different thicknesses ($40_R$, $40_G$, $40_B$) in the respective pixel regions, uses a light resonance structure where the light path length is optimized so that resonance optimal to the emission wavelength required in each of the pixel regions 101, 102, and 103 can be generated.

The second insulating layer 40 may be a single layer (not shown), or may have a multilayer structure of a fourth insulating layer 41 and a fifth insulating layer 42. In the latter case, the fourth insulating layer 41 can be a stopper layer for chemical mechanical polishing processing. In other words, the fourth insulating layer 41 is an insulating layer made of a material less easily polished than the fifth insulating layer 42 in the chemical mechanical polishing processing. For example, the fourth insulating layer 41 is made of silicon nitride, and the fifth insulating layer 42 is made of silicon oxide.

When the second insulating layer 40 has a multilayer structure of the fourth insulating layer 41 and the fifth insulating layer 42, the first surface 40a is formed of the fourth insulating layer 41 in the thinnest portion of the second insulating layer 40 (third pixel region 103). In the first pixel region 101 and the second pixel region 102, the first surface 40a is formed of the fifth insulating layer 42.

The light-emitting elements 50 (50R, 50G, 50B) are provided on the second insulating layer 40 in the respective pixel regions. Each of the light-emitting elements 50 has a pixel electrode 51 (51R, 51G, 51B), a light-emitting function layer 52 (52R, 52G, 52B), and the counter electrode 53 (53R, 53G, 53B).

The pixel electrodes 51 (51R, 51G, 51B) are formed of a transparent oxide conductive material such as indium tin oxide (ITO) and $ZnO_2$, for example. In this embodiment, the pixel electrodes 51 are formed of ITO. Since the pixel electrodes 51 in the different pixel regions are not electrically connected to one another, they can function as individual electrodes of the light-emitting elements 50.

The light-emitting function layer 52 (52R, 52G, 52B) is formed to cover the pixel electrodes 51. In more detail, the light-emitting function layer 52 is formed continuously throughout the plurality of light-emitting elements 50 (50R, 50G, 50B). The light-emitting property of the light-emitting function layer 52 is common to the plurality of light-emitting elements 50. The light-emitting function layer 52 is assumed to include a hole injection layer, a hole transport layer, a light-emitting layer (the first light-emitting layer and the second light-emitting layer), an electron transport layer, and an electron injection layer.

The light-emitting layer is a layer of an organic light-emitting material that develops an electroluminescence phenomenon. By applying a voltage between the pixel electrode 51 and the counter electrode 53, holes are injected from the hole transport layer, and electrons are injected from the electron transport layer, into the light-emitting function layer 52 (light-emitting layer). Light is emitted when these holes and electrons are recombined in the light-emitting layer. In this embodiment, white light is emitted, for example.

The counter electrode 53 (53R, 53G, 53B) is formed to cover the light-emitting function layer 52. In other words, the counter electrode 53 (53R, 53G, 53B) is formed continuously throughout the plurality of light-emitting elements 50. That is, the counter electrode 53 can be a common electrode in the plurality of light-emitting elements 50. The counter electrode 53 functions as a transflective layer having a nature of transmitting part of light having reached its surface and reflecting the other part of the light (i.e., a transflective property).

The counter electrode 53 is formed of magnesium (Mg) and silver (Ag), or a magnesium-silver alloy (MgAg) including these as main elements. In this embodiment, the counter electrode 53 is formed by co-evaporating magnesium and silver on the light-emitting function layer 52.

In the organic EL device 100, a resonator structure is formed where light emitted by the light-emitting function layer 52 resonates between the reflection film 30 and the counter electrode 53. That is, light emitted by the light-emitting function layer 52 travels between the reflection film 30 and the counter electrode 53, during which light of a specific wavelength is intensified by resonance, and the resultant light passes through the counter electrode 53 to travel toward the observer (upward in FIG. 1) (top emission scheme).

The thicknesses of the second insulating layers 44 (40R, 40G, 40B) in the respective light-emitting regions are adjusted so that red is intensified out of the white color emitted by the light-emitting function layer 52R in the light-emitting element 50R, green is intensified in the light-emitting element 50G, and blue is intensified in the light-emitting element 50B. By this adjustment, it is possible to set the distance between the reflection film 30R and the counter electrode 53R at Hr in the first pixel region 101, set the distance between the reflection film 30G and the counter electrode 53G at Hg shorter than Hr in the second pixel region 102, and set the distance between the reflection film 30B and the counter electrode 53B at Hb shorter than. Hg in the third pixel region 103 (Hr>Hg>Hb).

On the counter electrode 53, a passivation layer (not shown) made of an inorganic material is formed. The passivation layer is a protection film for preventing entry of water and outside air into the light-emitting elements 50. The passivation layer is formed of an inorganic material low in gas permeability, such as silicon nitride and silicon oxynitride.

A color filter substrate 71 is opposed to an element substrate 60 that includes the light-emitting elements 50. The color filter substrate 71 is formed of a material having a light transmission property such as glass. Color filters 72 (72R, 72G, 72B) and a light-shielding film 73 are formed on the surface of the color filter substrate 71 facing the element substrate 60. The light-shielding film 73 is a film having a light-shielding property that has openings 74 at positions corresponding to the light-emitting elements 50. The color filters 72 (72R, 72G, 72B) are formed in the openings 74.

The red color filter 72R that selectively transmits red light is formed in the opening 74 corresponding to the light-emitting element 50R. The green color filter 72G that selectively transmits green light is formed in the opening 74 corresponding to the light-emitting element 50G. The blue color filter 72B that selectively transmits blue light is formed in the opening 74 corresponding to the light-emitting element 50B.

The color filter substrate 71 with the color filters 72 and the light-shielding film 73 formed thereon is bonded to the element substrate 60 via a sealing layer 75. The sealing layer 75 is formed of a transparent resin material, e.g., a curing resin such as epoxy resin.

Although not shown, the organic EL device 100 may not have the color filters 72 if it has such a structure that the light-emitting element 50R emits red light, the light-emitting element 50G emits green light, and the light-emitting element 50B emits blue light.

The organic EL device 100 of this embodiment has the following feature, for example.

In the organic EL device 100, the third insulating layer 20 for thickness adjustment is provided on the first insulating layer 10 in the second pixel 102 (or 103) where thickness adjustment of the second insulating layer 40 is necessary for adjustment of the light path length. With this provision, the first surface 40a of the second insulating layer 40 can be planarized, eliminating the necessity of providing a light-shielding member between the first pixel 101 and the second pixel 102, and also permitting prevention of parasitic light emission caused by a step. That is, the display quality can be improved.

Figure 6:
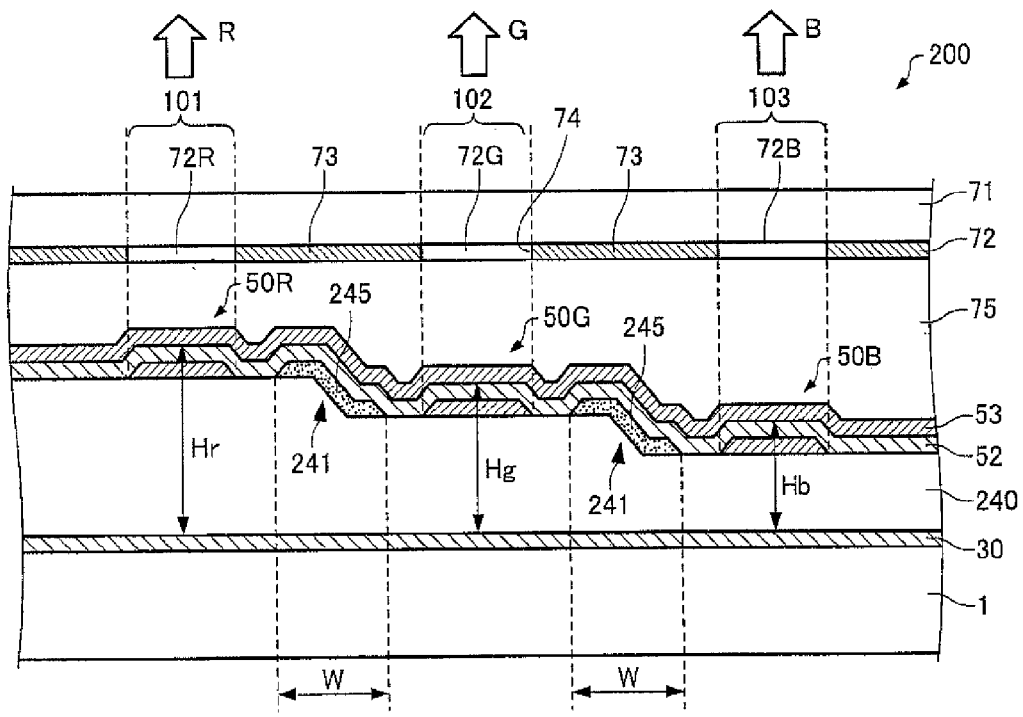
FIG. 6 is a cross-sectional view schematically showing the structure of a conventional organic EL device.

For example, FIG. 6 shows a cross-sectional view of a conventional organic EL device 200 where the third insulating layer 20 is not provided. Note that components similar in configuration to those of the organic EL device 100 of this embodiment are denoted by like reference characters and description of such components is omitted here.

As shown in FIG. 6, without provision of the third insulating layer 20, the thickness of a second insulating layer 240 must be made different among the pixel regions for light path adjustment of the light output in the pixel regions. Therefore, as shown in FIG. 6, steps 241 are formed in portions between the pixel regions on an upper surface 240a of the second insulating layer 240. In this case, parasitic light emission occurs due to the steps 241. It is therefore necessary to form light-shielding films 245 on the steps to prevent or reduce such parasitic light emission.

In contrast to the above, in the organic EL device 100 of this embodiment, no step is formed on the upper surface 40a of the second insulating layer 40 achieving a flat surface as described above. Therefore, parasitic light emission can be prevented or reduced without the necessity of providing a light-shielding film.

Also, when a step is formed in a portion between any pixel regions, it is necessary to form a light-shielding film having a width W, for example, as shown in FIG. 6. In contrast to this, in the organic EL device 100 of this embodiment, without the necessity of providing a light-shielding film formation region, the size of the light-emitting region per pixel can be increased. That is, it is possible to provide the organic EL device 100 where the area of the light-shielding film 73 covering the portions between the adjacent pixels can be made smaller and the area of the openings 74 can be made larger as viewed from top.

2. Fabrication Method for Organic EL Device

Next, a fabrication method for an organic EL device of this embodiment will be described with reference to the relevant drawings. FIGS. 2A to 4C are cross-sectional views schematically showing the fabrication method for an organic EL device of this embodiment. Note that the cross-sections of FIGS. 2A to 4C correspond to the cross-section of FIG. 1.

Figure 2A:
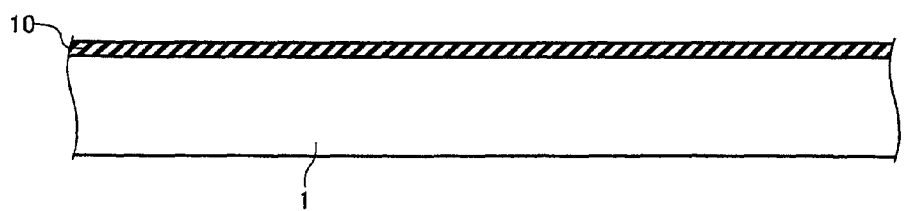
FIGS. 2A to 2C are cross-sectional views schematically showing the fabrication method for an organic EL device of the embodiment.

As shown in FIG. 2A, the first insulating layer 10 is formed on the substrate 1 (first insulating layer formation step). The first insulating layer 10 is a layer that can function as an etching stopper layer when the third insulating layer 20 is patterned by an etching technique as described above. The first insulating layer 10 may be provided by nitriding an upper surface portion of the substrate 1 made of silicon to form an insulating layer made of silicon nitride, or forming a film by a known film formation technique such as sputtering, chemical vapor deposition (CVD), and vacuum evaporation.

Figure 2B:
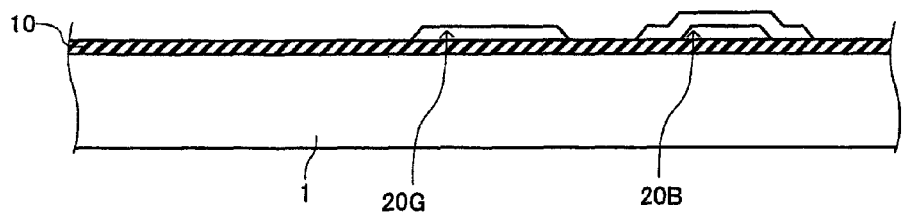

Thereafter, as shown in FIG. 2B, the third insulating layers 20 are formed on the first insulating layer 10 by a known etching technique using the first insulating layer 10 as an etching stopper (third insulating layer formation step). For example, an inorganic insulating film made of silicon oxide, etc. is formed on the entire surface by a known film formation technique such as sputtering and CVD or thermal oxidation processing, and then the formed film is patterned by a known photolithography technique and etching technique, to form the third insulating layers 20. As shown in FIG. 2B, in each pixel region, the third insulating layer 20 is made to have a multilayer structure appropriately to have a desired thickness.

The formation method of the third insulating layers 20 of which the thicknesses are different stepwise is not specifically limited, but may be as follows, for example. A precursor film is first formed on the entire surface to the thickness of the third insulating layer 20B that is to be the thickest. Thereafter, the precursor film is etched to have a predetermined thickness in the second pixel region 102 to form the third insulating layer 20G, and then removed by etching in the remaining regions including the first pixel region 101. Alternatively, the third insulating layers 20 of a multilayer structure having predetermined thicknesses may be formed by repeating a film formation step and an etching step.

Figure 2C:
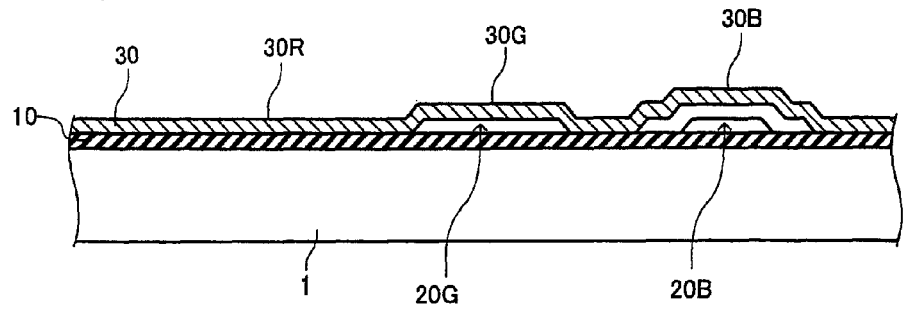

Thereafter, as shown in FIG. 2C, the reflection film 30 (30R, 30G, 30B) is formed to cover the first insulating layer 10 and the third insulating layers 20 using a known film formation technique such as evaporation and sputtering (reflection film formation step). For example, by forming an aluminum film, etc. by an evaporation method, the reflection film 30 (30R, 30G, 30B) may be formed integrally throughout the plurality of pixel regions. According to the fabrication method for an organic EL of this embodiment, under the reflection film 30 (e.g., the reflection film 30R and the reflection film 30G), the third insulating layer 20 causing a difference in surface position (height) between the reflection film 30R and the reflection film 30G is already formed. Therefore, even when the reflection film 30 is formed integrally using a known film formation technique such as sputtering, the surface position (height) from the first insulating layer 10 can be easily made different between the reflection film 30R and the reflection film 30G.

Figure 3A:
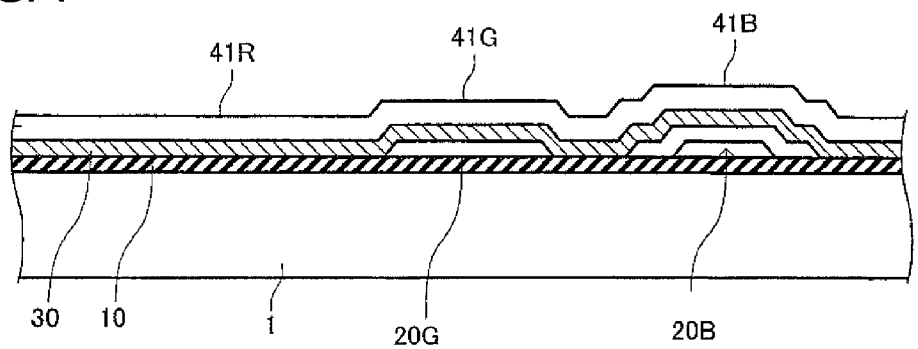
FIGS. 3A to 3C are cross-sectional views schematically showing the fabrication method for an organic EL device of the embodiment.
Figure 3B:
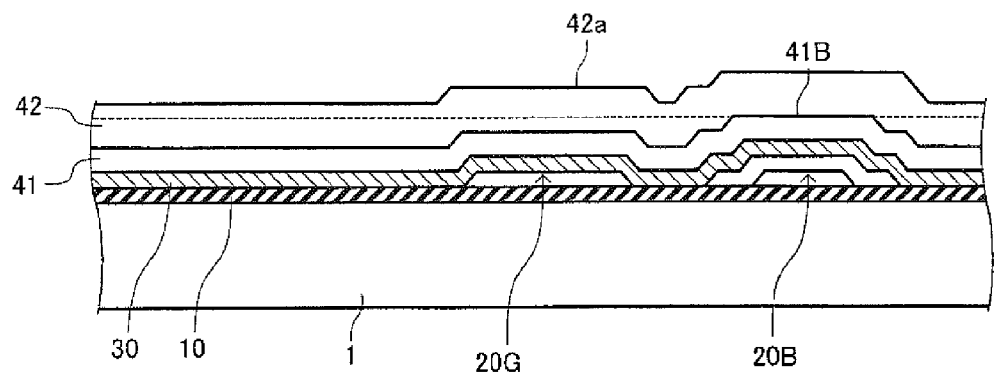
Figure 3C:
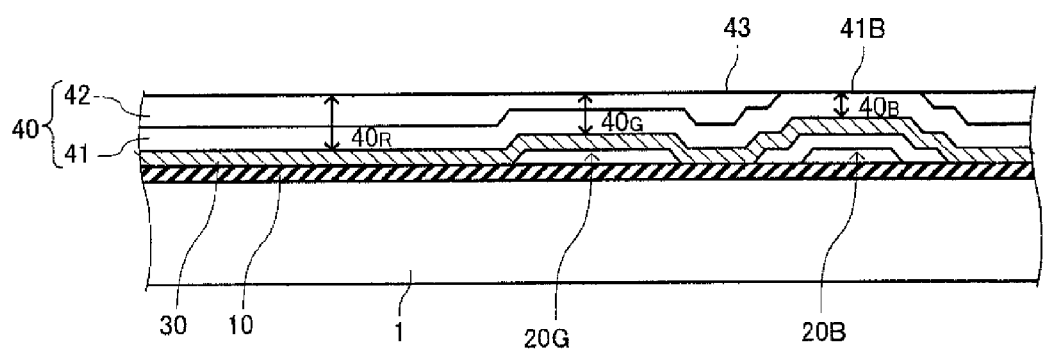

Next, as shown in FIGS. 3A to 3C, the second insulating layer 40 is formed by forming a precursor insulating layer to cover the reflection film 30 (e.g., the first and second reflection films 30R and 30G) continuously and then planarizing the upper surface of the precursor insulating layer (second insulating layer formation step).

In the step of forming the second insulating layer, forming the precursor insulating layer may include forming a fourth insulating layer 41 on the reflection film 30 and forming a fifth insulating layer 42 on the fourth insulating layer 41 (see FIGS. 3A and 3B).

Specifically, as shown in FIG. 3A, the fourth insulating layer 41 made of silicon nitride, for example, is formed on the reflection film 30 by a known film formation technique such as sputtering. By this formation, upper surfaces 41R, 41G, and 41B different in the height from the first insulating layer 10 are formed in the respective pixel regions.

Thereafter, as shown in FIG. 3B, the fifth insulating layer 42 made of silicon oxide, for example, is formed on the fourth insulating layer 41 by a known film formation technique such as sputtering. At this time, as shown in FIG. 3B, the thickness of the fifth insulating layer 42 is adjusted so that the surface position of an upper surface 42a is higher than the upper surface 41B of the fourth insulating layer 41 in the third pixel region 103.

In the planarization, as shown in FIG. 3C, the upper surface 42a of the fifth insulating layer 42 is subjected to chemical mechanical polishing processing using the fourth insulating layer 41 as a stopper layer, whereby the second insulating layer 40 having the flat first surface 40a can be formed. In this way, since the second insulating layer 40 has the fourth insulating layer 41 functioning as a stopper layer, the thickness of the second insulating layer 40 can be controlled more simply in the chemical mechanical polishing processing. Thus, since the error in the thickness of the second insulating layer 40 that may occur in the process of the chemical mechanical polishing processing is small, the fabrication method for an organic EL device with further improved reliability can be provided.

Although not shown, the second insulating layer 40 may be made of only the fifth insulating layer, and the second insulating layer 40 having a desired thickness may be formed by appropriately adjusting the planarization processing.

Figure 4A:
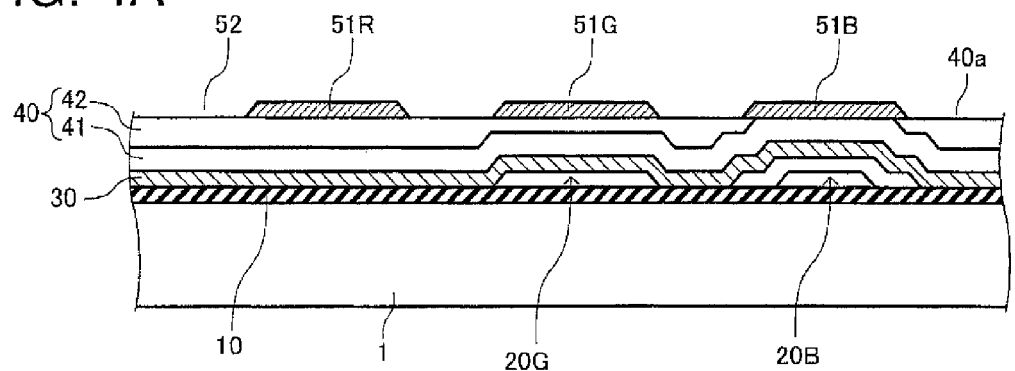
FIGS. 4A to 4C are cross-sectional views schematically showing the fabrication method for an organic EL device of the embodiment.

Next, as shown in FIG. 4A, the pixel electrodes 51 are formed on the planarized second insulating layer 40 (pixel electrode formation step). The method of forming the pixel electrodes 51 is not specifically limited, but may be as follows, for example. An indium tin oxide (ITO) film is formed on the entire surface of the second insulating layer 40 by a known film formation technique such as evaporation. Thereafter, this film is patterned by a photolithography technique and an etching technique, to form the pixel electrodes 51 (51R, 51G, 51B) in the respective pixel regions.

Figure 4B:
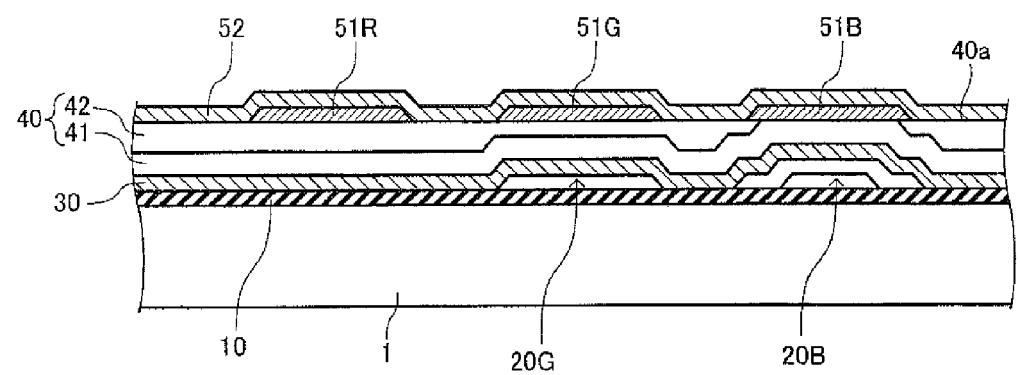

Thereafter, as shown in FIG. 4B, the light-emitting function layer 52 is formed on the second insulating layer 40 having the pixel electrodes 51 formed thereon (light-emitting function layer formation step). First, the hole transport layer (including the hole injection layer) constituting the light-emitting function layer 52 is formed on the pixel electrodes 51 and the second insulating layer 40. Specifically, the layer is formed by evaporating a material such as α-NPD according to a known evaporation method. Subsequently, the light-emitting layer and the electron transport layer (including the electron injection layer) are formed on the upper surface of the hole transport layer. Specifically, the films are formed by performing evaporation according to a known evaporation method.

Figure 4C:
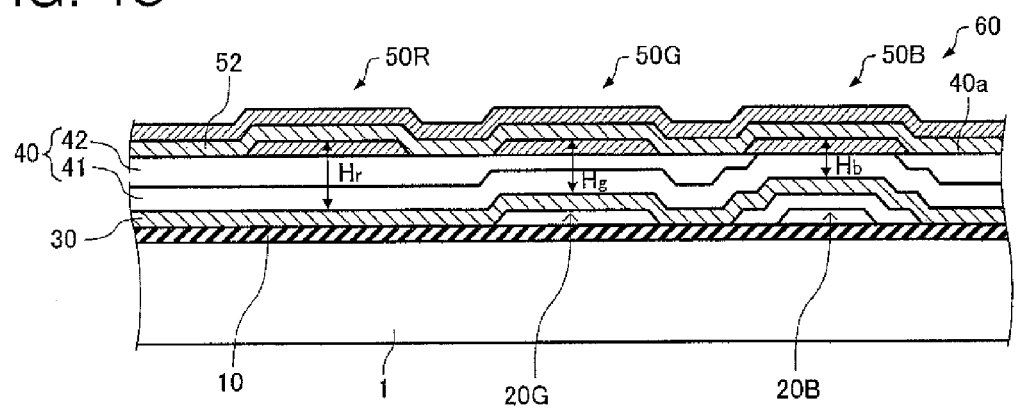

Thereafter, as shown in FIG. 4C, the counter electrode 53 is formed on the light-emitting function layer 52 (electron transport layer) (counter electrode formation step). Specifically, magnesium (Mg) and silver (Ag), or a magnesium silver alloy (MgAg) including these as main elements, are co-evaporated on the light-emitting function layer 52 to form the counter electrode 53.

Although not shown, the passivation layer for preventing degradation of the light-emitting elements 50 due to an influence of oxygen and water is formed on the counter electrode 53. Specifically, such a layer is formed by evaporating a material such as silicon oxynitride according to a known evaporation method, for example.

By following the above-described steps, the element substrate 60 having the light-emitting elements 50 can be fabricated.

Next, the sealing layer 75, the color filter substrate 71, etc. are formed to complete the organic EL device 100 (see FIG. 1).

The sealing layer 75 is made of a curing resin such as epoxy resin, for example, and formed by CVD. It is preferable for the sealing layer 75 to have a multilayer structure so as to prevent entry of water to protect the light-emitting elements 50 from degradation.

Thereafter, the color filter substrate 71 provided with the filters 72 and the light-shielding film 73 is prepared. The color filters 72 and the light-shielding film 73 are formed by a known film formation technique, thereby forming the color filters 72 (72R, 72G, 72B) corresponding to the respective light-emitting elements 50 (50R, 50G, 50B).

The element substrate 60 and the color filter substrate 71 are then bonded together to complete the organic EL device 100. Specifically, they are bonded together via the sealing layer 75 in a nitrogen atmosphere isolated from the outside air. In this way, the organic EL device 100 can be fabricated.

According to the fabrication method for an organic EL device of this embodiment, the following feature, for example, can be obtained.

According to the fabrication method for an organic EL device, which includes the step of forming the third insulating layer 20 capable of adjusting the thickness of the second insulating layer 40 on the first insulating layer 10, it is possible to provide the organic EL device 100 where the first surface of the second insulating layer 40 is planarized in a simple process. That is, with no step formed on the second insulating layer 40, it is unnecessary to form a light-shielding film (see FIG. 6) extra. Thus, the organic EL device where parasitic light emission is prevented or reduced can be fabricated by a simpler method.

3. Configuration of Electronic Apparatus

Figure 5:
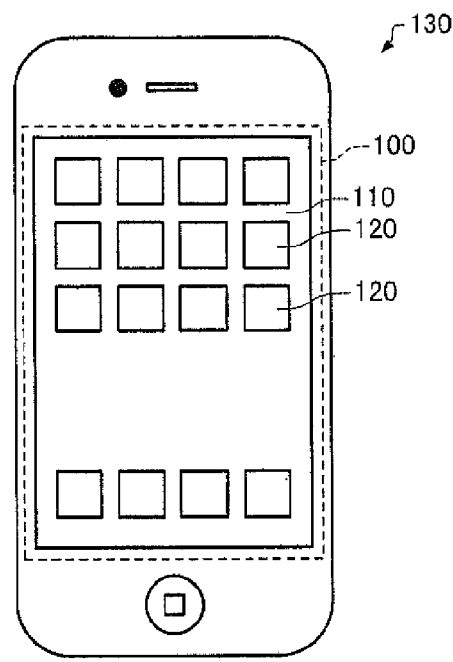
FIG. 5 is a schematic view showing an example of an electronic apparatus provided with an organic EL device.

FIG. 5 is a schematic view showing a smartphone as an example of an electronic apparatus provided with the organic EL device 100 fabricated by the fabrication method for an organic EL device of this embodiment. The configuration of the smartphone provided with the organic EL device will be described with reference to FIG. 5.

As shown in FIG. 5, the smartphone 130 has a display section 110 and icons 120. The display section 110 can present high-quality display because parasitic light emission is prevented or reduced by the organic EL device 100 embedded therein. The organic EL device 100 can be used, not only for the smartphone 130 described above, but also for various types of electronic apparatuses such as cellular phones, head-mounted displays, small-sized projectors, mobile computers, digital cameras, digital video cameras, car-mounted apparatuses, audio apparatuses, exposure apparatuses, and lighting apparatuses.

It is to be understood that the invention includes configurations substantially identical (e.g., in function, method, and result, or in objective and advantage) to the configuration described in the description of exemplary embodiments. It is also to be understood that the invention includes configurations where a non-essential part of the configuration described in the description of exemplary embodiments has been altered. It is further to be understood that the invention includes configurations that produce the same effect, or configurations that can attain the same objective, as that obtained by the configuration described in the description of exemplary embodiments. In addition, it is to be understood that the invention includes configurations where a known technique is added to the configuration described in the description of exemplary embodiments.

It should be noted that, when it is expressed that specific B (hereinafter referred to "B") is provided (formed) on specific A (hereinafter referred to "A"), the meaning is not limited to that B is directly provided (formed) on A, but also includes the case that B is provided (formed) on A via a third material as far as the effect of the invention is not impaired.

What is claimed is:

1. An organic EL device comprising:
   a first pixel having a first insulating layer, a first reflection film provided on the first insulating layer, a second insulating layer provided on the first reflection film, a first pixel electrode provided on the second insulating layer, a first light-emitting layer provided on the first pixel electrode, and a first counter electrode provided on the first light-emitting layer, first-color light capable of being resonated between the first reflection film and the first counter electrode; and
   a second pixel having the first insulating layer, a third insulating layer provided on the first insulating layer, a second reflection film provided on the third insulating layer, the second insulating layer provided on the second reflection film, a second pixel electrode provided on the second insulating layer, a second light-emitting layer provided on the second pixel electrode, and a second counter electrode provided on the second light-emitting layer, second-color light capable of being resonated between the second reflection film and the second counter electrode, wherein
   the third insulating layer is removed in a first pixel region during fabrication,
   the second insulating layer has different thicknesses in the first pixel and the second pixel and has a flat first surface, and
   the first pixel electrode and the second pixel electrode is formed on the flat first surface of the second insulating layer.

2. The organic EL device according to claim 1, wherein the first reflection film and the second reflection film are formed integrally.

3. The organic EL device according to claim 1, wherein the first insulating layer includes silicon nitride and the third insulating layer includes silicon oxide.

4. The organic EL device according to claim 1, further comprising a precursor insulating layer to continuously cover the first reflection film and the second reflection film, wherein
   the different thicknesses of the second insulating layer are formed by planarizing an upper surface of the precursor insulating layer.

5. The organic EL device according to claim 4, further comprising:
   a fourth insulating layer provided on the first reflection film and the second reflection film; and
   a fifth insulating layer provided on the fourth insulating layer, wherein
   the fifth insulating layer is removed in a second pixel region during fabrication.

6. The organic EL device according to claim 5, wherein the fourth insulating layer includes silicon nitride and the fifth insulating layer includes silicon oxide.

* * * * *